United States Patent [19]

Hastreiter

[11] Patent Number: 4,667,181
[45] Date of Patent: May 19, 1987

[54] KEYBOARD DATA INPUT ASSEMBLY

[75] Inventor: James J. Hastreiter, Eden Prairie, Minn.

[73] Assignee: Honeywell Inc., Minneapolis, Minn.

[21] Appl. No.: 514,218

[22] Filed: Jul. 15, 1983

[51] Int. Cl.⁴ ............................................. G06F 3/02
[52] U.S. Cl. .......................... 340/365 A; 340/365 C; 340/825.79
[58] Field of Search .......... 340/365 A, 365 S, 825.79, 340/825.94, 365 R, 365 C, 365 L, 365 VL, 365 E, 825.95, 825.96, 825.82, 825.85; 364/709, 712; 200/5 A, DIG. 1; 178/17 C, 18; 179/90 K; 361/351, 352, 397, 398, 400, 416

[56] References Cited

U.S. PATENT DOCUMENTS

| | | | |
|---|---|---|---|
| 3,245,051 | 4/1966 | Robb | 340/825.94 |
| 3,503,031 | 3/1970 | Nyhus et al. | 340/365 A |
| 3,590,158 | 6/1971 | Pabst | 340/365 A |
| 3,750,114 | 7/1973 | Valassis | 340/825.82 |
| 3,778,815 | 12/1973 | Wright | |
| 4,074,262 | 2/1978 | Namiya et al. | 340/365 S |
| 4,081,898 | 4/1978 | Taylor, Jr. et al. | 364/712 |
| 4,104,727 | 8/1978 | Washizuka et al. | 364/712 |
| 4,148,017 | 4/1979 | Tomisawa | |
| 4,186,385 | 1/1980 | Nagashima | |
| 4,194,425 | 3/1980 | Kitagawa | 340/365 S |
| 4,222,638 | 9/1980 | Magerl | |
| 4,296,406 | 10/1981 | Pearson | 340/365 A |
| 4,336,529 | 6/1982 | Buan | 340/365 R |
| 4,365,244 | 12/1982 | Gillesen et al. | 340/825.82 |
| 4,441,097 | 4/1984 | Anderson | 340/365 A |

FOREIGN PATENT DOCUMENTS

| | | | |
|---|---|---|---|
| 8102223 | 8/1981 | PCT Int'l Appl. | 340/365 A |
| 1541566 | 3/1979 | United Kingdom | 340/365 A |
| 2095036 | 9/1982 | United Kingdom | 340/365 A |

Primary Examiner—John W. Caldwell, Sr.
Assistant Examiner—Mahmoud Fatahi-Yar
Attorney, Agent, or Firm—Charles L. Rubow

[57] ABSTRACT

A keyboard assembly is disclosed in which complementary arrays of first and second switch contacts are connected in equal sets and each set of first contacts is connected to a separate set of second contacts through a diode so that the connected sets of contacts do not contain contacts from the same switch, thus permitting keyboard terminals individually associated with the connected sets of first and second contacts to be sequentially enabled while reading the unenabled terminals to determine actuated switches.

11 Claims, 4 Drawing Figures

KEYBOARD DATA INPUT ASSEMBLY

BACKGROUND OF THE INVENTION

The invention disclosed herein relates generally to keyboard data input assemblies, and more particularly to such assemblies including circuitry for minimizing the required number of interconnections with a microprocessor or other apparatus with which a keyboard is used. The invention also includes a keyboard circuit board layout for use in such assemblies.

Keyboards having a plurality of key switch devices are particularly well suited for use in data processing systems. In general, the number of signals which must pass between a keyboard and associated data processing system is the same as the number of switch devices. Each of these signals can be carried over a separate interconnection. However, particularly in large keyboards, the resulting number of interconnections may be prohibitive.

One technique which can be used to reduce the number of interconnections involves the use of logic gates for providing an encoded signal indicative of actuated switches. U.S. Pat. No. 3,778,815 issued to C. Wright on Dec. 11, 1973 discloses a keyboard encoder in which logic gates respond to a portion of a group of timing pulses by applying binary signals through an actuated key switch in one direction. The logic gates also respond to the remaining timing pulses by applying binary signals through the switch in the opposite direction. After passing through a switch, a signal is gated through one of two logic circuits under the control of the same timing pulse employed to produce the signal. In this arrangement, depending on the relative portion of the logic gates located at the keyboard, the number of interconnections with an associated data processing system can be substantially reduced.

Another technique commonly used for reducing the required number of keyboard interconnections involves connecting the key switch devices between column and row conductors in a conductor matrix. When actuated, a switch device provides continuity between the column and row conductors associated therewith. In operation, enabling signals from the data processing system may be sequentially coupled to each column (or row) conductor for scanning the keyboard for depressed keys. A depressed key is sensed when the enabling signal from its column (or row) conductor is present on its row (or column) conductor. In such a system having J columns and K rows, the data processing system must provide J (or K) enabling signals for the columns, and monitor K (or J) row conductors. As a result, J +K signals are required to pass between the keyboard and the data processing system. This generally requires a like number (J +K) of interconnections between the keyboard and data processing system in contrast to J×K interconnections if each switch is connected separately.

A variety of techniques have been employed to further simplify matrix keyboard apparatus and reduce the number of interconnections between such keyboards and data processing systems associated therewith. For example, U.S. Pat. No. 4,148,017 issued to N. Tomisawa on Apr. 3, 1979 discloses a circuit for detecting key switch operation in a matrix keyboard wherein the array of switches is divided into blocks. First terminals of switches in a block are commonly connected and second terminals of corresponding switches in all blocks are commonly connected. A signal is transmitted to all column conductors and transferred through an actuated switch to a block conductor of the associated block. This signal is sent back through the block conductor and appears on the column conductor of the actuated switch. The position of the actuated switch is determined by detecting the column on which the signal appears.

U.S. Pat. No. 4,186,385 issued to S. Nagashima on Jan. 29, 1980 discloses a matrix keyboard assembly wherein the switches are connected in two groups such that the first group is coupled to first inputs of AND gates in a first group of such gates and the second group is coupled to first inputs of AND gates in a second group of such gates. Second inputs of the AND gates in the first and second groups are individually connected together and coupled to a separate switch from each of the first and second groups of switches so that actuation of a switch will coincidently energize both inputs of a corresponding gate.

U.S. Pat. No. 4,222,038 issued to R. Magerl on Sept. 9, 1980 discloses matrix keyboard input circuitry in which the number of interconnections is reduced by providing a counter/decoder at the keyboard which is operated in synchronism with a register in the data processing system. The counter/decoder is, thus, caused to sequentially enable columns in the keyboard matrix by means of a clock signal which is supplied over one conductor. The states of the rows (i.e., whether a row is coupled to an enabled column through a depressed key) is transmitted back to the data processing system over data conductors.

Each of the previously described techniques can be used to reduce the number of interconnections between keyboard apparatus and a data processing system. The reductions are accomplished by means of circuit elements and devices such as logic gates and counter/decoders which are not overly complex. However, there is a continuing demand to further reduce the required number of interconnections and to further simplify the circuitry used to achieve such reductions.

The applicant has devised a matrix keyboard with interface circuitry comprising only a small number of diodes which permits the same set of interconnections to carry both enabling signals to the keyboard and read-out signals from the keyboard. Accordingly, the number of keyboard/data processing system interconnections is minimized and the use of minimum interconnections is made possible with exceedingly simple interface circuitry.

SUMMARY OF THE INVENTION

The present invention comprises an array of key actuatable switches, each having first and second contacts. The contacts are grouped into equal sets of first contacts and second contacts respectively, and the contacts in each set connected together. Separate sets of first contacts are connected to separate sets of second contacts through diodes whereby the sets of first contacts can be enabled, one set at a time, without enabling the other sets of first contacts, and whereby during enabling of a set of first contacts, the sets of second contacts other than the one connected through a diode to the enabled set of first contacts can be read to determine switch actuation.

A keyboard adapted for this application may comprise a circuit board having first and second portions of which at least one is flexible, and each having an array of contacts thereon arranged to be in substantial alignment when the portions of the board are positioned to overlay one another. Each column of contacts in one array is connected to form a set. The contacts in the other array are connected in sets either from a single row or from two adjacent rows, a first set comprising successive contacts from a first row and each additional set comprising the remaining contacts in a row containing contacts from the preceding set plus sufficient successive contacts from the opposite end of the next row to fill the set.

DESCRIPTION OF THE PREFERRED EMBODIMENT

Figure 1:
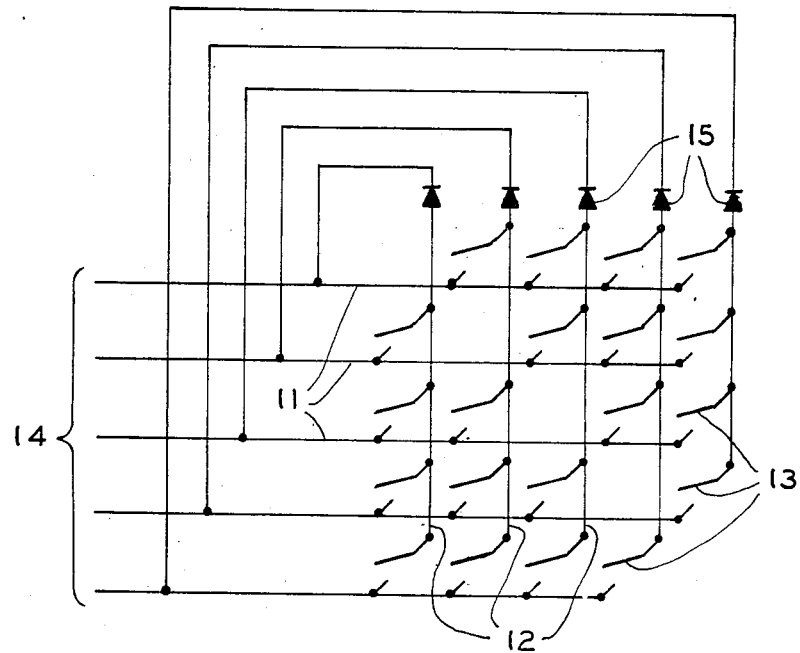
FIG. 1. is a schematic representation of a keyboard and interface circuitry in accordance with the applicant's invention.

Schematically illustrated in FIG. 1 is a five by five matrix of keyboard conductors. Although a five by five matrix is shown, the apparatus and circuitry layout of the present invention may be easily adapted to a square matrix of any size. As will be hereinafter described in greater detail, although there are equal numbers of column and row conductors, the locations schematically illustrated at intersections of the column and row conductors lying along one diagonal cannot be used for switch points. Therefore, when the keyboard is laid out in a more conventional manner, a five by four (more generally, an N by N×1) array of key switches results.

The conductor matrix includes a first plurality of conductors 11 and a second plurality of conductors 12. Although the pluralities of conductors are represented by sets of parallel horizontal and vertical lines for illustrative purposes, it should be noted that conductors in an actual keyboard matrix may follow a considerably more complex and irregular pattern.

As illustrated in FIG. 1, a switch 13 is located at each intersection of the conductors 11 and 12 except along one diagonal group of intersections. Accordingly, switches 13 are shown and may be described as an array of switches arranged in a plurality of rows and a plurality of columns. For purposes of the following description, the terms "rows" and "columns" refer to an idealized electrical layout of a keyboard. The terms are intended to cover a variety of physical configurations regardless of whether or not the switches are actually arranged in regular columns and rows.

Switches 13 are key actuatable switches, each having a pair of contacts. One contact of each of the switches is connected to one of conductors 11, and the other contact of each switch is connected to one of conductors 12. Each of conductors 11 is connected directly to a keyboard terminal, of which a plurality of such terminals is generally identified by reference numeral 14. Each of conductors 12 is connected to a separate one of conductors 11 through a diode 15 which is shown as having its cathode connected to a conductor 11 and its anode connected to a conductor 12.

In operation, terminals 14 are normally supplied with a bias voltage which biases conductors 11 to a predetermined state and reverse biases diodes 15 so that conductors 12 electrically float. Supplying an enabling or strobe signal to one of terminals 14 forward biases the diode connected to that terminal and applies the enabling signal to the conductor 12 connected to that diode. Actuation of a switch having a contact connected to that conductor electrically couples it to one of terminals 14 and overcomes the bias voltage at that terminal. The terminals other than the enabled terminal can then be read to determine switch actuation.

The keyboard can be connected directly to any suitable data processor which has bidirectional input/output ports. With diodes 15 poled as shown, the data processor is assumed to provide a slight positive bias when the keyboard terminals are used to input data to the processor. A low state provided as an enabling signal will overcome the bias when a switch is actuated so that a low state is impressed at the corresponding data processor input terminal. In the event that a data processor using an opposite polarity convention is used, a corresponding reversal of diode polarity is required.

Figure 2:
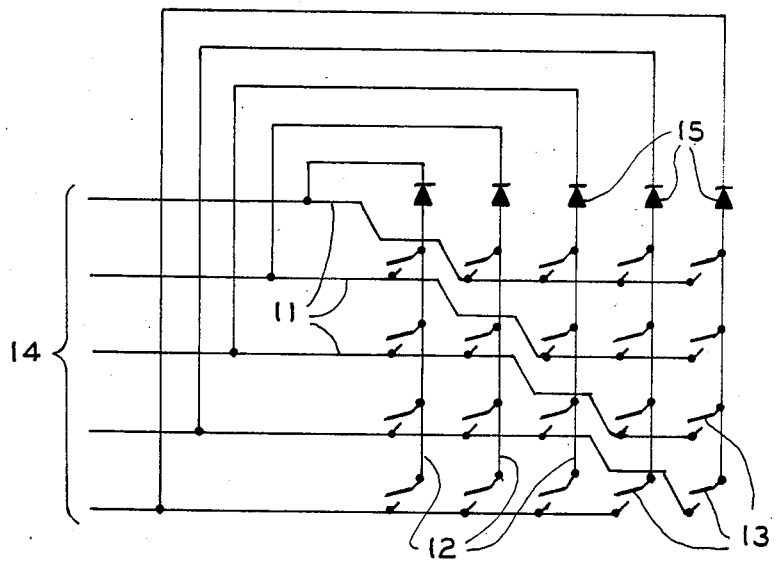
FIG. 2 is a schematic representation of the keyboard and interface circuitry shown in FIG. 1 with key switches repositioned to provide a more conventional keyboard layout.

As has been indicated in connection with FIG. 1, key switches cannot be accommodated along one diagonal set of intersections of the conductor matrix. FIG. 2 illustrates how the conductor matrix can be laid out to avoid a blank diagonal space in the key switch array so as to produce a more conventional keyboard arrangement. The various elements in FIG. 2 corresponding to elements in FIG. 1 are identified by the same reference numerals. As can be seen, the principal difference between the schematics of the two figures is that conductors 11 in FIG. 2 form a stepped pattern whereas conductors 11 in FIG. 1 are straight.

In both FIGS. 1 and 2, each switch 13 has a first contact which is coupled to a conductor 11 and a second contact which is coupled to a conductor 12. The first and second contacts are separately connected in equal sets or groups. In the arrangement illustrated in FIG. 2, there are five (N) switches in each row in the array and four (N−1) switches in each column in the array. Each of conductors 11 and 12 connects N−1 contacts.

With reference to conductors 12, the contacts in a set or group comprise the contacts in a column. With reference to conductors 11, since there are N columns, each conductor 11 connects less than the number of contacts in a row. Specifically, a first set of contacts connected by conductors 11 comprises N−1 successive contacts in a first row. Additional sets are formed of the remaining contacts in the previously described row plus sufficient successive contacts at the opposite end of the next row to provide a total of N−1 contacts in the set. Each set comprises contacts from either a single row or two adjacent rows.

With reference to both FIGS. 1 and 2, it is pointed out that conductors 11 and 12 connected by each diode 15 are associated only with contacts which are not part of the same switch.

Figure 3:
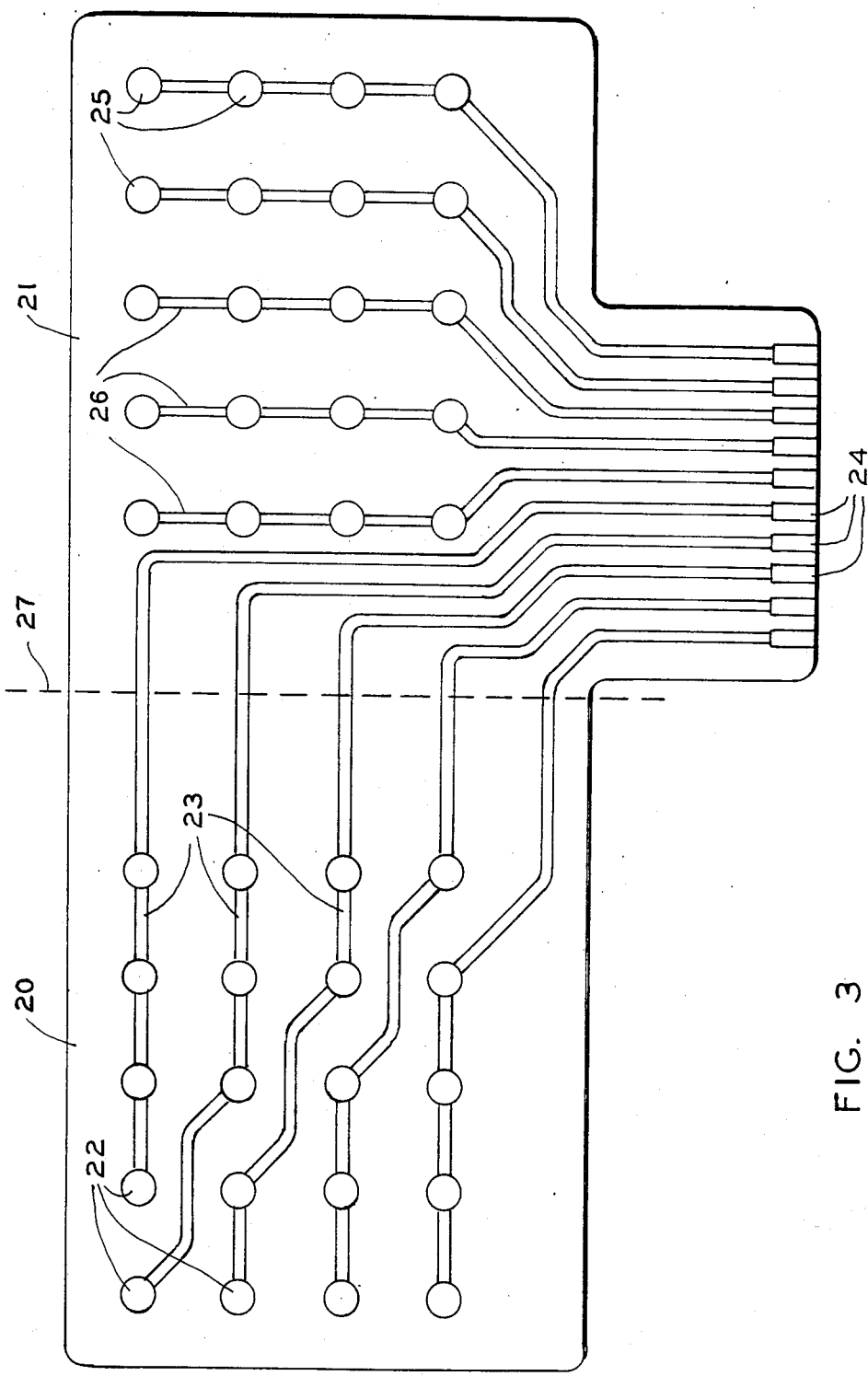
FIG. 3 is a plan view of a printed circuit board with conductive areas thereon arranged to produce the keyboard of FIG. 2.

The printed circuit board of FIG. 3 is laid out to provide the key switch array arrangement of FIG. 2. The circuit board comprises a flexible dielectric sheet having first and second portions identified by reference numerals 20 and 21. A conductive pattern is formed on one surface of the portions of the dielectric sheet. A first portion of the conductive pattern on portion 20 of the dielectric sheet comprises an array of first contacts 22. A second portion of the conductive pattern on portion 20 comprises a set of conductors 23 which connect contacts 22 in equal sets or groups, and connect each set or group to a separate circuit board terminal 24.

A first portion of the conductive pattern on portion 21 of the dielectric sheet comprises an array of second contacts 25. A second portion of the conductive pattern on portion 21 comprises a set of conductors 26 which connect the contacts in each column to each other and to a separate circuit board terminal 24. Conductors 26 connect contacts 25 in sets each containing the same number of contacts as in the sets of contacts 22.

The circuit board is of a type which can be folded on itself along dashed line 27 in FIG. 3. The folded circuit board is shown in the exploded view of FIG. 4. Arrays of contacts 22 and 25 are arranged so that individual contacts of one array are substantially aligned with individual contacts of the other array when the circuit board is folded so that portion 20 overlays portion 21.

Figure 4:
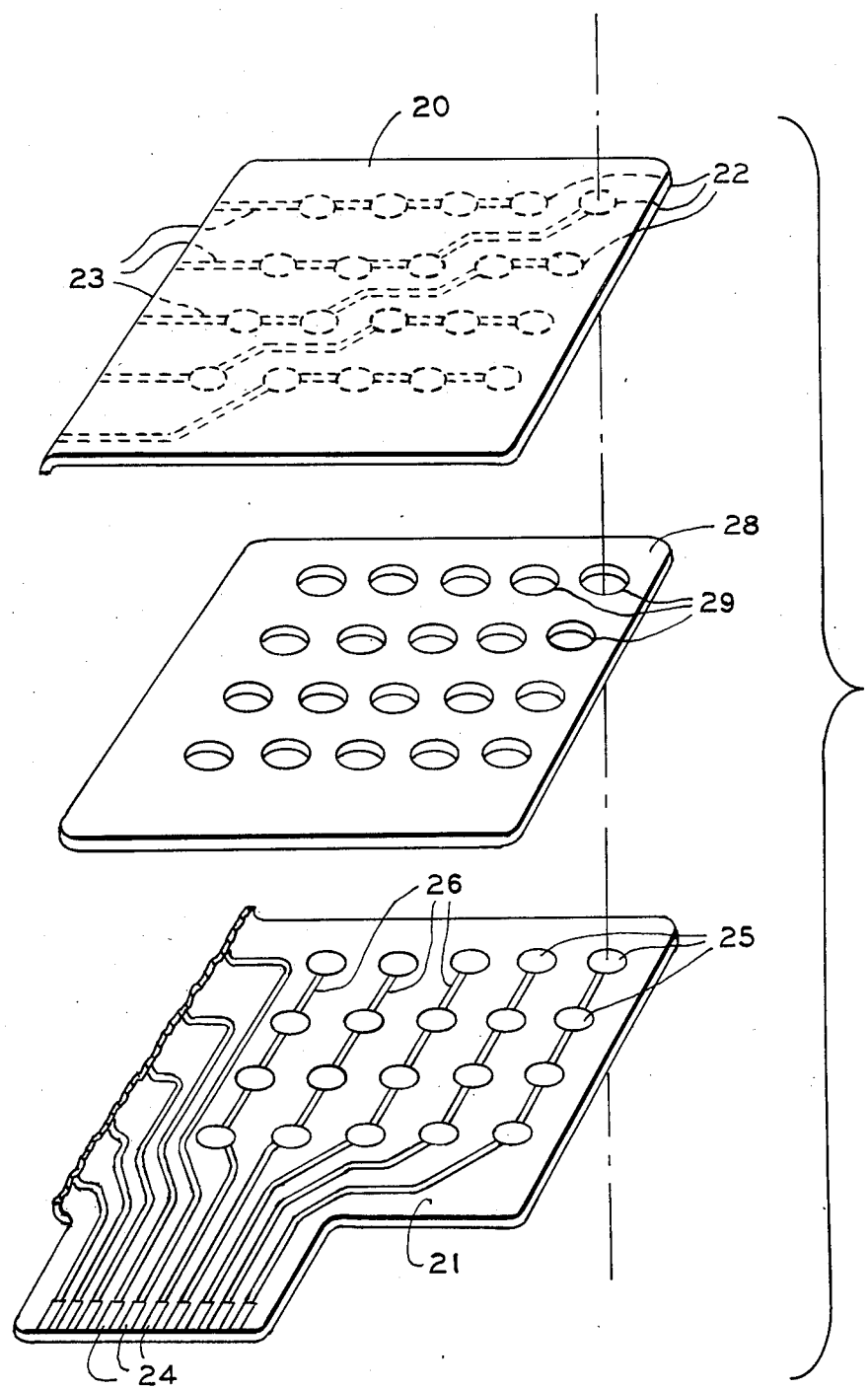
FIG. 4 is an exploded view of a keyboard circuit board assembled from the circuit board of FIG. 3.

A spacer 28 is positioned between portions 20 and 21 of the circuit board as shown in FIG. 4. Spacer 28 is in the form of a sheet having apertures 29 therethrough arranged for alignment with contacts 22 and 25. Spacer 28 is, thus, of a design which permits the spacing between contacts in the pairs of contacts to be varied. As illustrated, the circuit board is flexible so that pressure thereon at the location of a contact pair from a manually operated key (not shown) causes electrical continuity between one of conductors 23 and one of conductors 26.

The diodes for permitting the same interconnections to be used for both sequentially energizing sets of contacts and reading the signal on conductors coupled to the energized sets of contacts through actuated switches are not shown in FIGS. 3 and 4. However, they can be simply connected between appropriate terminals 24 along with any other desired circuitry and interconnections with a data processing system.

In accordance with the foregoing description, a keyboard matrix having $N \times (N-1)$ key switches requires only N interconnections with an associated data processing system. The circuitry required to permit the same interconnections to be used both for carrying enabling signals to the keyboard and carrying readout signals from the keyboard is very simple, comprising only N diodes.

Although a specific embodiment of the applicant's invention has been shown for illustrative purposes, variations and modifications of the teachings herein will be apparent to those skilled in the relevant arts. It is not intended that coverage be limited to the embodiment shown, but only by the terms of the following claims.

The embodiments of the invention in which an exclusive property or right is claimed are defined as follows:

1. A keyboard data input assembly comprising:
    an array of key actuatable switches each having first and second contacts;
    a first set of conductors in which each conductor is connected to the first contacts of a plurality of said switches, each of the first contacts being connected to only one conductor of said first set of conductors;
    a second set of conductors in which each conductor is connected to the second contacts of a plurality of said switches, each of the second contacts being connected to only one conductor of the second set of conductors; and
    a plurality of diodes, each diode having an anode connected to a separate conductor of said first set of conductors and having a cathode connected to a separate conductor of said second set of conductors.

2. The keyboard of claim 1 in which one of said first and second sets of conductors is adapted to carry signals to and from the keyboard.

3. Membrane keyboard apparatus comprising:
    dielectric sheet means having first and second portions, at least one of which is flexible;
    first and second patterns of electrically conductive material on first surfaces of the first and second portions of said dielectric sheet means respectively, first portions of the first and second patterns forming pairs of switch contacts, each pair having a contact in each of said first and second patterns, the contacts of a pair being arranged to be substantially aligned when the first portion of said sheet means is positioned to overlay the second portion of said sheet means, second portions of said first and second patterns respectively connecting the switch contacts in N groups of $N-1$ contacts each; and
    spacer means interposed between the first surfaces of the first and second portions of said dielectric sheet means so as to normally maintain a predetermined separation between the first surfaces, said spacer means being of a design which permits the spacing between the contacts in the pairs of contacts to be varied.

4. The membrane keyboard apparatus of claim 3 further including a plurality of diodes, each diode being connected between a separate group of contacts in said first pattern and a separate group of contacts in said second pattern.

5. The membrane keyboard apparatus of claim 3 wherein:
    the pairs of switch contacts are arranged in a matrix having N columns and $N-1$ rows;
    the switch contacts in each column on one of the first and second portions of said dielectric sheet are connected; and
    the switch contacts on the other of the first and second portions of said dielectric sheet means are connected in groups comprising contacts either from a single row or from two adjacent rows, a first group comprising $N-1$ successive contacts in a first row and each additional group comprising the remaining contacts in the row containing contacts from the previously defined group plus sufficient successive contacts from the opposite end of the next row to make a total of $N-1$ contacts.

6. The membrane keyboard apparatus of claim 5 further including a plurality of diodes, each diode being connected between a separate column of switch contacts on said one pf the first and second portions of said dielectric sheet means and a separate group of switch contacts on said other of the first and second portions of said dielectric sheet means.

7. Membrane keyboard apparatus comprising:
    dielectric sheet means having first and second portions of which at least one portion is flexible;
    a first array of conductive contacts formed on the first portion of said dielectric sheet means, said first array comprising N columns of N−1 contacts per column;

first conductor means connecting the contacts in said first array into groups of N−1 contacts each;

a second array of conductive contacts formed on the second portion of said dielectric sheet means, said second array comprising N−1 rows of N contacts per row, the contacts of said second array being arranged to be substantially aligned with the contacts of said first array when the first portion of said dielectric sheet means is folded onto the second portion thereof;

second conductor means connecting the contacts in said second array into groups of N−1 contacts each; and spacer means positioned between the first and second portions of said dielectric sheet means so as to normally separate the contacts in said first array from the contacts in said second array, said spacer means being adapted to permit electrical continuity between corresponding contacts of said first and second arrays in response to pressure on the flexible portion of said dielectric sheet means at the location of a contact thereon.

8. The membrane keyboard apparatus of claim 7 wherein:

terminal means comprising a plurality of terminals is formed on said dielectric sheet means;

said first conductor means connects each group of contacts in said first array to a separate terminal; and said second conductor means connects each group of contacts in said second array to a separate terminal.

9. The membrane keyboard apparatus of claim 7 including a diode connecting each of the groups of contacts in said first array to a separate group of contacts in said second array.

10. The membrane keyboard apparatus of claim 7 wherein:

said first conductor means connects the contacts in said first array so that each of the columns of contacts forms a group; and said second conductor means connects the contacts in said second array so that each of the groups of contacts is from a single row or two adjacent rows, with a first group being formed of N−1 successive contacts in a first row and each additional group being formed of the remaining contacts from a row containing contacts in a preceding group and sufficient successive contacts at the opposite end of the following row to bring the total number of contacts in the group to N−1.

11. The membrane keyboard apparatus of claim 7 wherein:

a switch is formed by each contact in said first array and the contact aligned therewith in the second array; and each of the groups of contacts in said second array is connected to a separate group of contacts in said first array through a diode so that the connected groups of contacts do not contain contacts from the same switch.

* * * * *